United States Patent
Chuang

(10) Patent No.: US 9,107,322 B2
(45) Date of Patent: Aug. 11, 2015

(54) FAST RAIL BRACKET SECURING STRUCTURE FOR SERVER

(71) Applicant: Ming-Hua Chuang, Changhua (TW)

(72) Inventor: Ming-Hua Chuang, Changhua (TW)

(73) Assignee: Bin Yuann Firstline Industrial Corp., Changhua (TW)

( * ) Notice: Subject to any disclaimer, the term of this patent is extended or adjusted under 35 U.S.C. 154(b) by 129 days.

(21) Appl. No.: 13/970,544

(22) Filed: Aug. 19, 2013

(65) Prior Publication Data

US 2015/0048041 A1 Feb. 19, 2015

(51) Int. Cl.
*H05K 7/14* (2006.01)

(52) U.S. Cl.
CPC ..................... *H05K 7/1489* (2013.01)

(58) Field of Classification Search
CPC ........... A47B 88/0418; A47B 88/0422; A47B 88/044; A47B 96/024; A47B 96/06; A47B 96/1441; H05K 7/1421; H05K 7/1489; H05K 7/18; H05K 7/183
USPC .......................................................... 211/26
See application file for complete search history.

(56) References Cited

U.S. PATENT DOCUMENTS

| | | | |
|---|---|---|---|
| 8,104,626 B2 * | 1/2012 | Huang et al. ..................... 211/26 |
| 8,235,339 B2 * | 8/2012 | Selvidge et al. ......... 248/220.21 |
| 8,371,454 B2 * | 2/2013 | Chen et al. ....................... 211/26 |
| 8,596,471 B2 * | 12/2013 | Chen et al. ....................... 211/26 |
| 8,602,225 B2 * | 12/2013 | Lin et al. .......................... 211/26 |
| 8,727,138 B2 * | 5/2014 | Dittus et al. ..................... 211/26 |
| 8,870,311 B2 * | 10/2014 | Chang ......................... 312/334.4 |
| 2008/0304903 A1 * | 12/2008 | Huang ........................... 403/230 |
| 2009/0250421 A1 * | 10/2009 | Wang et al. .................... 211/183 |
| 2010/0187960 A1 * | 7/2010 | Liang ........................... 312/334.1 |
| 2012/0018605 A1 * | 1/2012 | Lacarra ....................... 248/224.8 |
| 2012/0292274 A1 * | 11/2012 | Lin et al. .................... 211/86.01 |
| 2012/0292928 A1 * | 11/2012 | Chang et al. .................. 292/273 |
| 2014/0117180 A1 * | 5/2014 | Chen et al. ................. 248/219.1 |
| 2014/0363108 A1 * | 12/2014 | Chen et al. ....................... 384/22 |
| 2014/0363109 A1 * | 12/2014 | Chen et al. ....................... 384/22 |

* cited by examiner

*Primary Examiner* — Joshua Rodden
(74) *Attorney, Agent, or Firm* — Che-Yang Chen; Law Office of Michael Chen

(57) ABSTRACT

A rail bracket securing structure may have a locking base, a sliding block and a locking rack. One end of locking base has a hook portion bended perpendicularly to the locking base, and a receiving space is formed at the other end thereof, and an outer restricting piece is formed at both sides outside the hook portion. The sliding block is U-shaped with two parallel pins and a driving portion, and the sliding block is disposed at the receiving space of the locking base and the pins are protruding at the hook portion. One end of the locking rack has a fixed portion that is used to conjugate with a rail at its outer portion, and the other end has a covering board to cover the receiving space of the locking base, so that the sliding block is restricted between the locking base and the locking rack.

7 Claims, 9 Drawing Sheets

FAST RAIL BRACKET SECURING STRUCTURE FOR SERVER

FIELD OF THE INVENTION

The present invention relates to a rail bracket securing structure, and more particularly to a fast rail bracket securing structure for server.

BACKGROUND OF THE INVENTION

A conventional rail securing structure for server is shown in FIG. 9, which may include a rail 60, a cover 70 and a pushing block 80. One end of the rail 60 has a connecting piece 61 that has a through hole 62. The cover 70 is connected with the connecting piece 61 and has a receiving space 71 toward the direction connecting piece 61. Two hook portions 72 are protrudingly formed at the front end of the receiving space 71 of the cover 70, and the hook portions 72 are bended perpendicularly toward the rail 60. The pushing block 80 has a pushing portion 81 and two pushing rods 82 extend from both sides of the pushing portion 81. A spring 83 is formed at the place where the pushing portion 81 connects with the pushing rods 82, and the pushing block 80 is disposed at the receiving space 71. Furthermore, the pushing portion 81 exposes at the through hole 62 of the connecting piece 61, so the pushing block 80 can be operated. One end of the spring 83 is disposed against the wall of the receiving space 71 and the pushing rod 82 is protrudingly disposed at the hook portion 72 of the cover 70, so the pushing block 80 can be pushed when the pushing rod 82 pushes the spring 83 and the hook portion 72 of the cover 70 can engage with the server cabinet (not shown), and the pushing rod 82 can be disposed into the server cabinet to complete the rail 60 installation process.

SUMMARY OF THE INVENTION

The technical problem the present invention wants to solve is that the pushing block 80 is disposed at the receiving space 71 of the cover 70 and pushed by the spring 83. If the receiving space 71 is too small, it may be difficult to move the pushing block 80. On the other hand, if the receiving space 71 is too big, the pushing block 80 may not be secured therein and more sliding resistance may be generated. Therefore, the precision of the pushing block 80 disposition has to be solved.

Secondly, the spring 83 is disposed at the pushing rod 82 of the pushing block 80 and the other end of the spring is disposed at the wall of the receiving space 71 of the cover 70. The sliding distance of the pushing block 80 equals to the compression length of the spring 83. In other words, the pushing block 80 is not restricted by other components and the spring 83 will be continuously pressed and the spring 83 may be deformed or become fatigue.

Finally, the cover 70 directly connects with the connecting piece 61 of the rail 60 and the pushing block 80 is disposed at the receiving space 71. Also, the connecting piece 61 and the rail 60 extends on the same plane, the distance between the pushing block 80 and rail is not sufficient and the movement of the rail may be disturbed by the server cabinet. Therefore, there remains a need for a new and improved rail bracket securing structure for serving to overcome the problems presented above.

The present invention provides a fast rail bracket securing structure for server may include a locking base, a sliding block and a locking rack. One end of the locking base has a hook portion bended perpendicularly to the locking base, and a receiving space is formed at the other end of the locking base, and the receiving space has two stopping pieces inside. The locking base has a positioning board reversibly perpendicular and located between two hook portions, and the positioning board has a screw hole with a corresponding bolt to increase the locking strength of the locking base. A restricting piece is formed at both sides outside the hook portion and a plurality of through holes are formed at the locking base. The sliding block is U-shaped with two parallel pins and a driving portion. The sliding block is disposed at the receiving space of the locking base and the pins are protruding at the hook portion. Furthermore, a guiding angle is formed at rear end of the pins so the sliding block can be more easily moved. A long slot is formed at each pin so the stopping piece can be inserted therein, and a spring is disposed between the long slot and the stopping piece. Also, the long slot has a stopping edge near the rear end of the pin, which is used to prevent the spring from popping out from the long slot. A guiding piece is formed at outer portion of the rear end of each pin, and the guiding piece is disposed at inner portion of the restricting piece. Also, the sliding block has a plurality of oval holes at the driving portion corresponding to the through holes. One end of the locking rack has a fixed portion that is used to conjugate with a rail at its outer portion, and the other end of the locking rack has a covering board to cover the receiving space of the locking base, so that the sliding block is restricted between the locking base and the locking rack. The locking rack has a curved portion between the fixed potion and the covering board to increase the distance between the rail and the sliding block. The locking rack also has a controlling opening at the covering board, so that the driving portion of the sliding block can partially expose outside the controlling opening to further enhance the operation of the sliding block. The covering board has a notch recessedly corresponding to the positioning board of the locking base, and the notch conjugates with the positioning board to secure the locking base and the lock rack. The covering board has a plurality of through openings, and a rod is corresponding to the through openings and through holes to restrict the movement of the sliding block when the rod passes through the oval hole. Both sides of the covering board has a protruding inner restricting piece facing the locking base, so that the inner restricting piece can be disposed against inner portion of the guiding piece, and the sliding block can slidingly move more smoothly between the inner restricting piece and the restricting piece through the guiding piece.

Comparing with the prior arts, the present invention is advantageous because (i) the outer portion of the guiding piece of the sliding block is disposed against the outer restricting piece of the locking base, while the inner portion of the guiding piece of the sliding block is disposed against the inner restricting piece of the locking base, so the sliding block, locking base and locking rack can be more precisely positioned and the smoothness of the movement of the sliding block is enhanced through the configuration of the guiding piece with the inner restricting piece and outer restricting piece. More importantly, the guiding piece can increase the pin's capability to sustain heavy objects, so the pins will not be easily deformed to increase the life of the sliding block; (ii) the spring is disposed between the long slot and the stopping piece. Also, the long slot has a stopping edge near the rear end of the pin, which is used to prevent the spring from popping out from the long slot; and the rod is corresponding to the through openings and through holes to restrict the movement of the sliding block when the rod passes through the oval hole and to further prevent the spring from being overly pressed which may cause fatigue of the spring; and (iii) the curved portion is formed between the fixed portion and covering board to provide a predetermined distance between the sliding block and rail, so the rail will not hit the supporting column during its movement to increase the conjugating strength.

DETAILED DESCRIPTION OF THE INVENTION

The detailed description set forth below is intended as a description of the presently exemplary device provided in accordance with aspects of the present invention and is not intended to represent the only forms in which the present invention may be prepared or utilized. It is to be understood, rather, that the same or equivalent functions and components may be accomplished by different embodiments that are also intended to be encompassed within the spirit and scope of the invention.

Unless defined otherwise, all technical and scientific terms used herein have the same meaning as commonly understood to one of ordinary skill in the art to which this invention belongs. Although any methods, devices and materials similar or equivalent to those described can be used in the practice or testing of the invention, the exemplary methods, devices and materials are now described.

All publications mentioned are incorporated by reference for the purpose of describing and disclosing, for example, the designs and methodologies that are described in the publications that might be used in connection with the presently described invention. The publications listed or discussed above, below and throughout the text are provided solely for their disclosure prior to the filing date of the present application. Nothing herein is to be construed as an admission that the inventors are not entitled to antedate such disclosure by virtue of prior invention.

Figure 1:
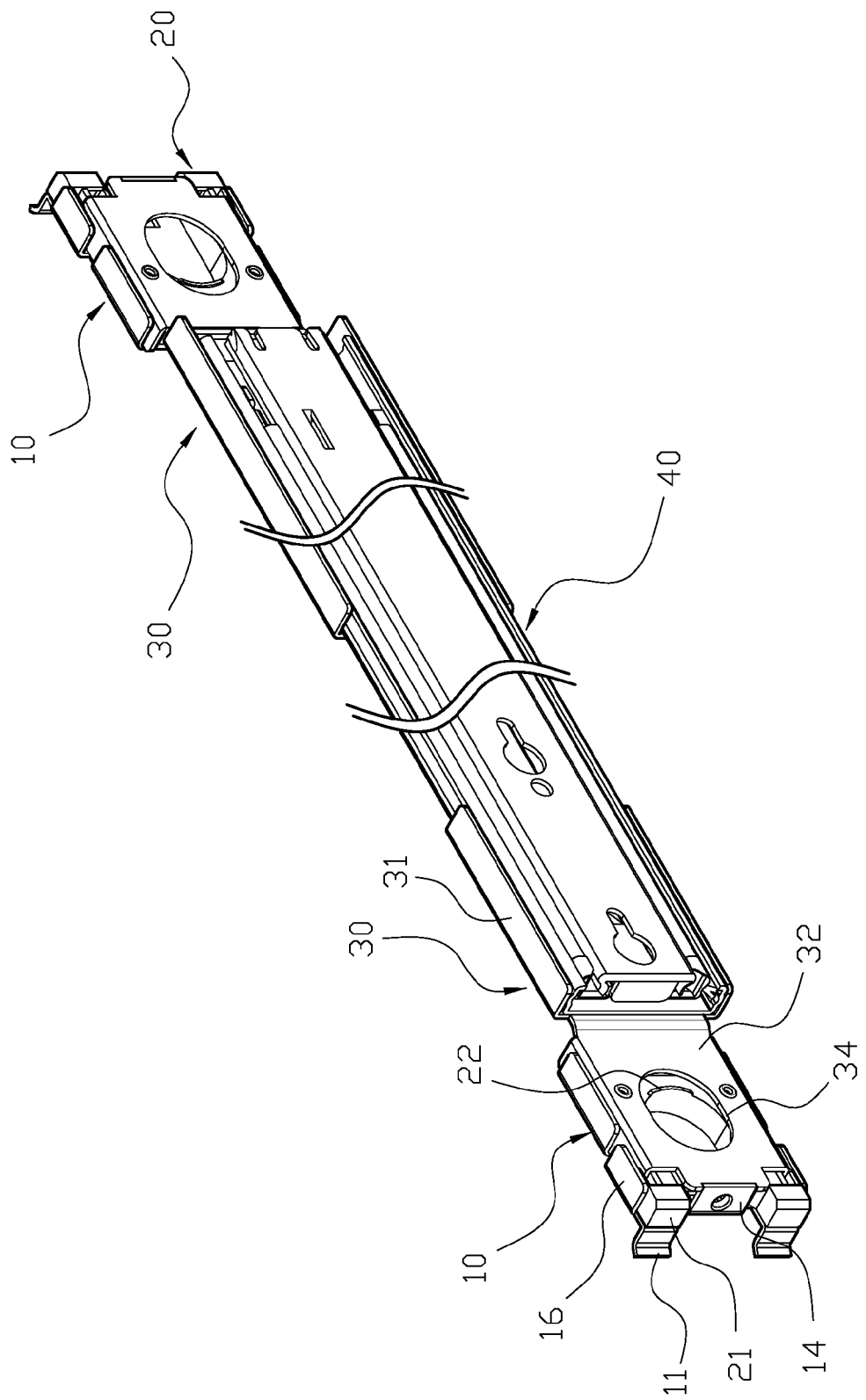
FIG. 1 illustrates a three-dimensional view of the present invention.
Figure 2:
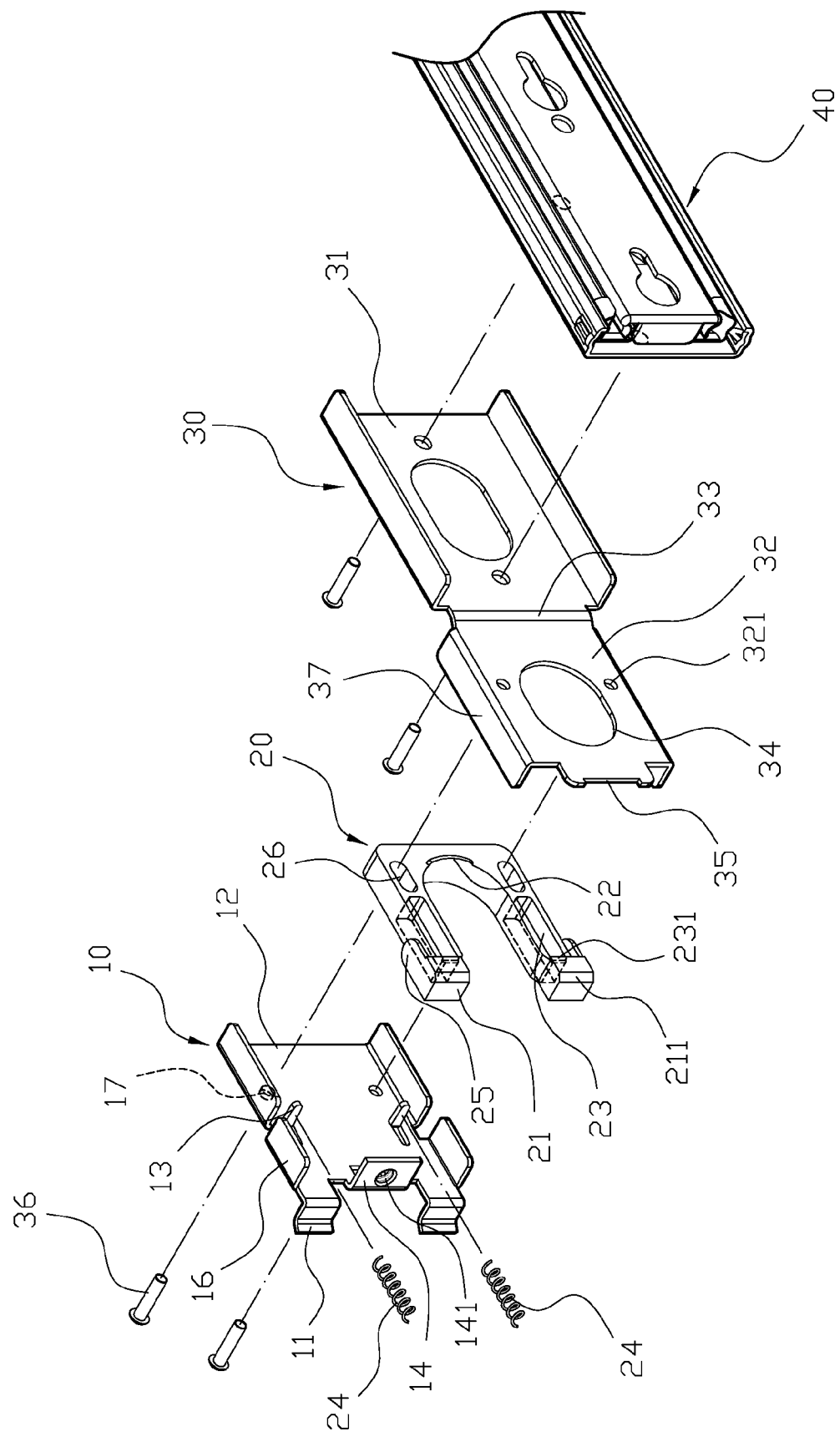
FIG. 2 illustrates an exploded view of the securing structure in the present invention.
Figure 3:
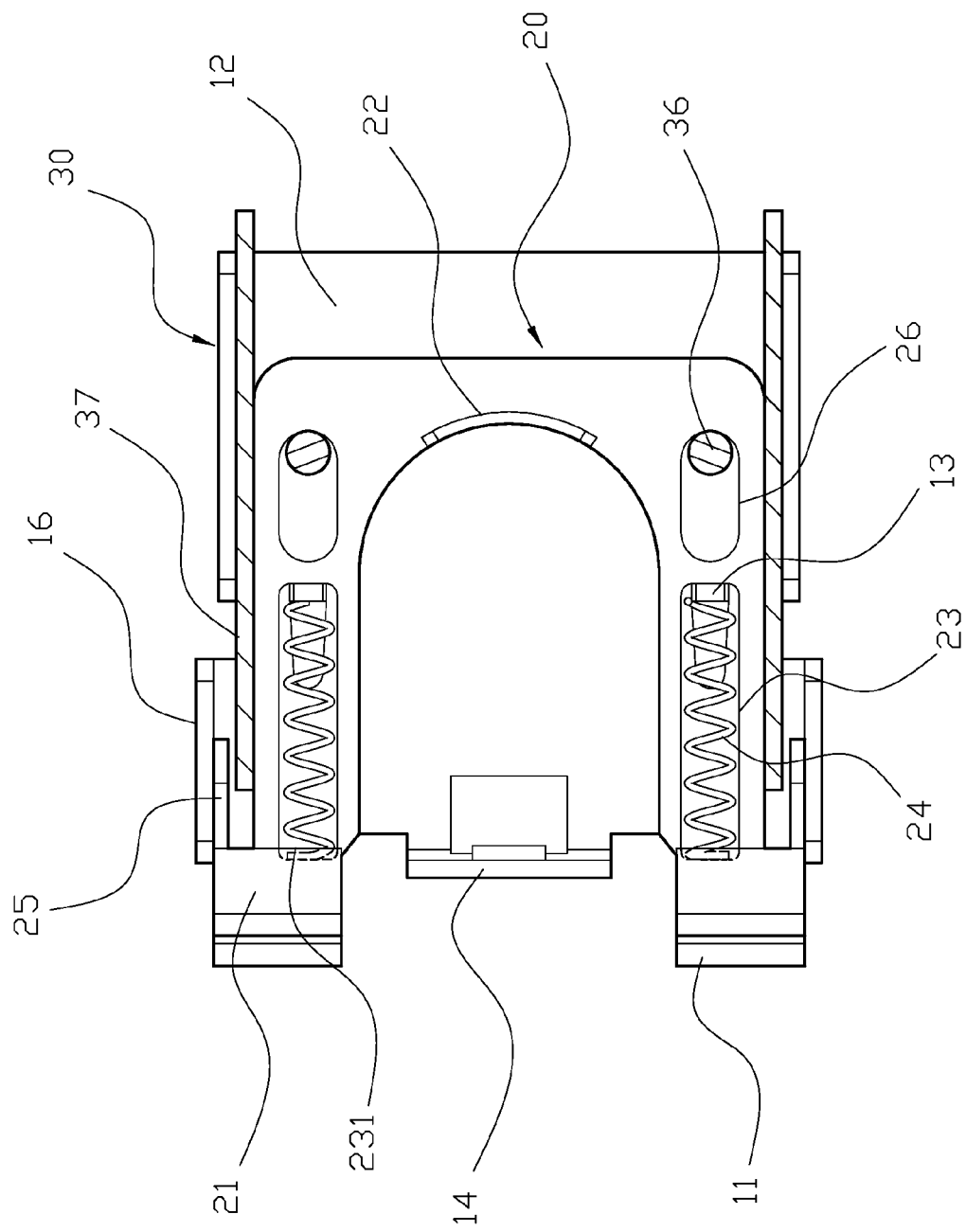
FIG. 3 illustrates a sectional view of the securing structure in the present invention.
Figure 7:
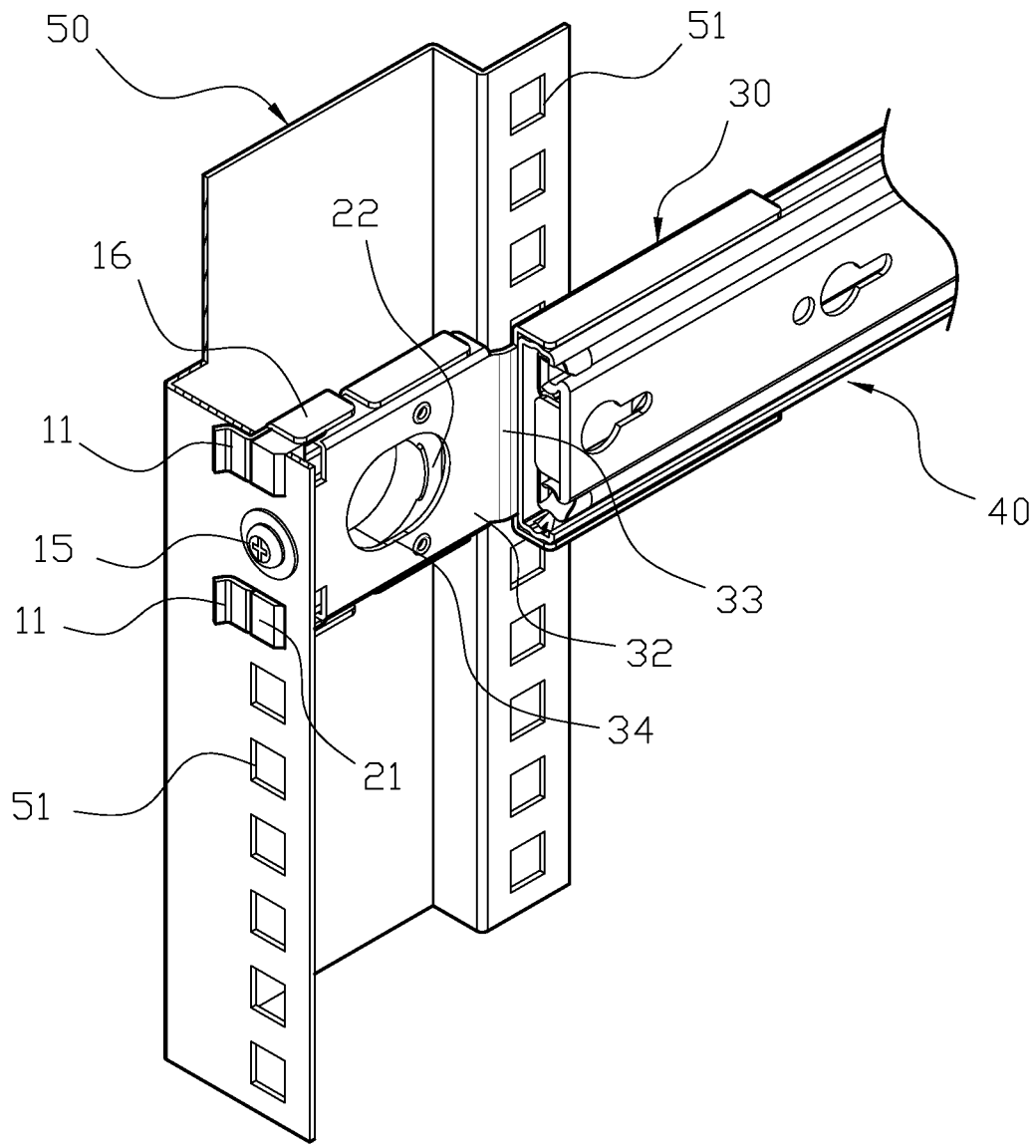
FIG. 7 illustrates a third schematic view of the fast rail bracket securing structure in the present invention when in use.
Figure 8:
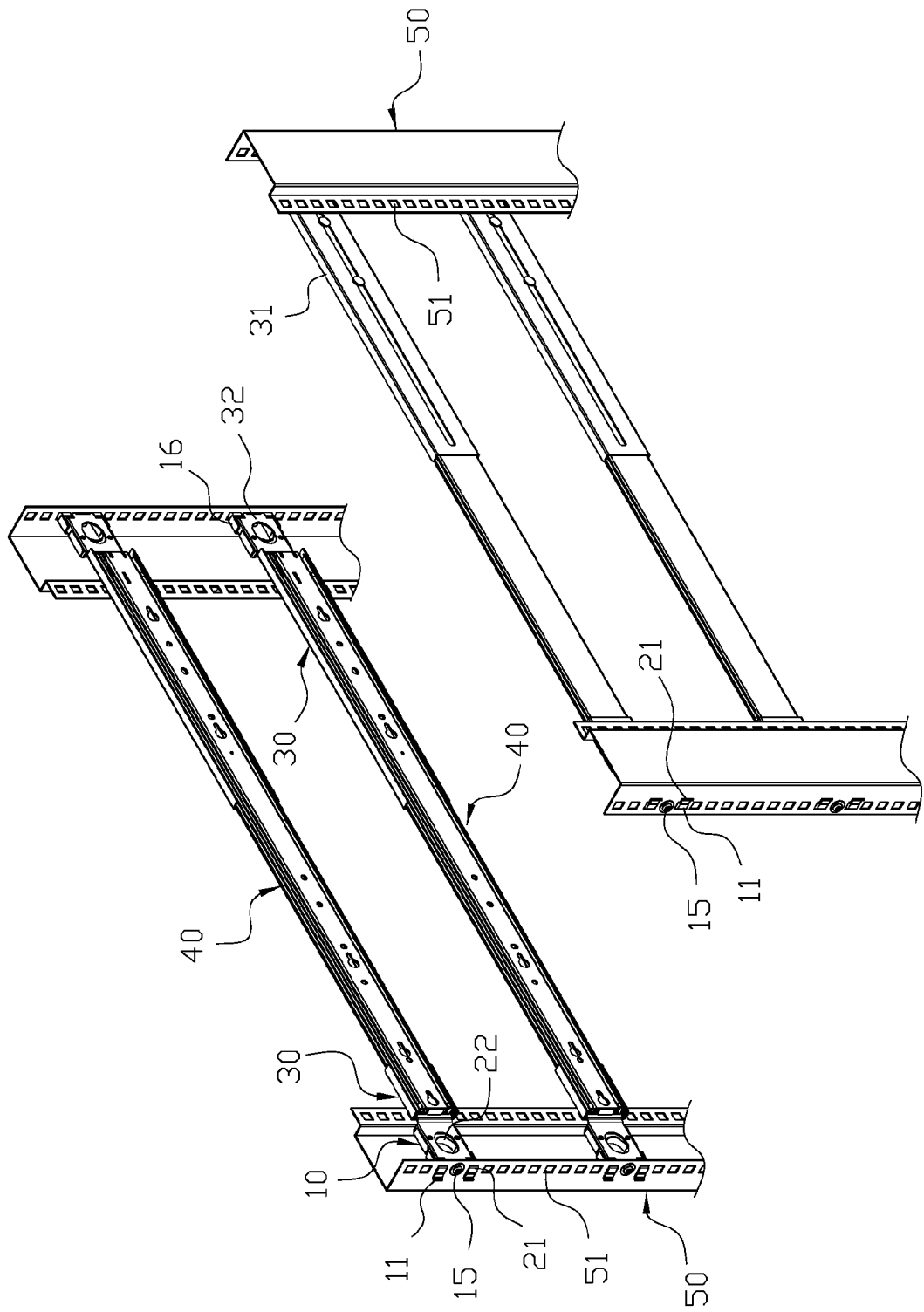
FIG. 8 illustrates a fourth schematic view of the fast rail bracket securing structure in the present invention when in use.
Figure 9:
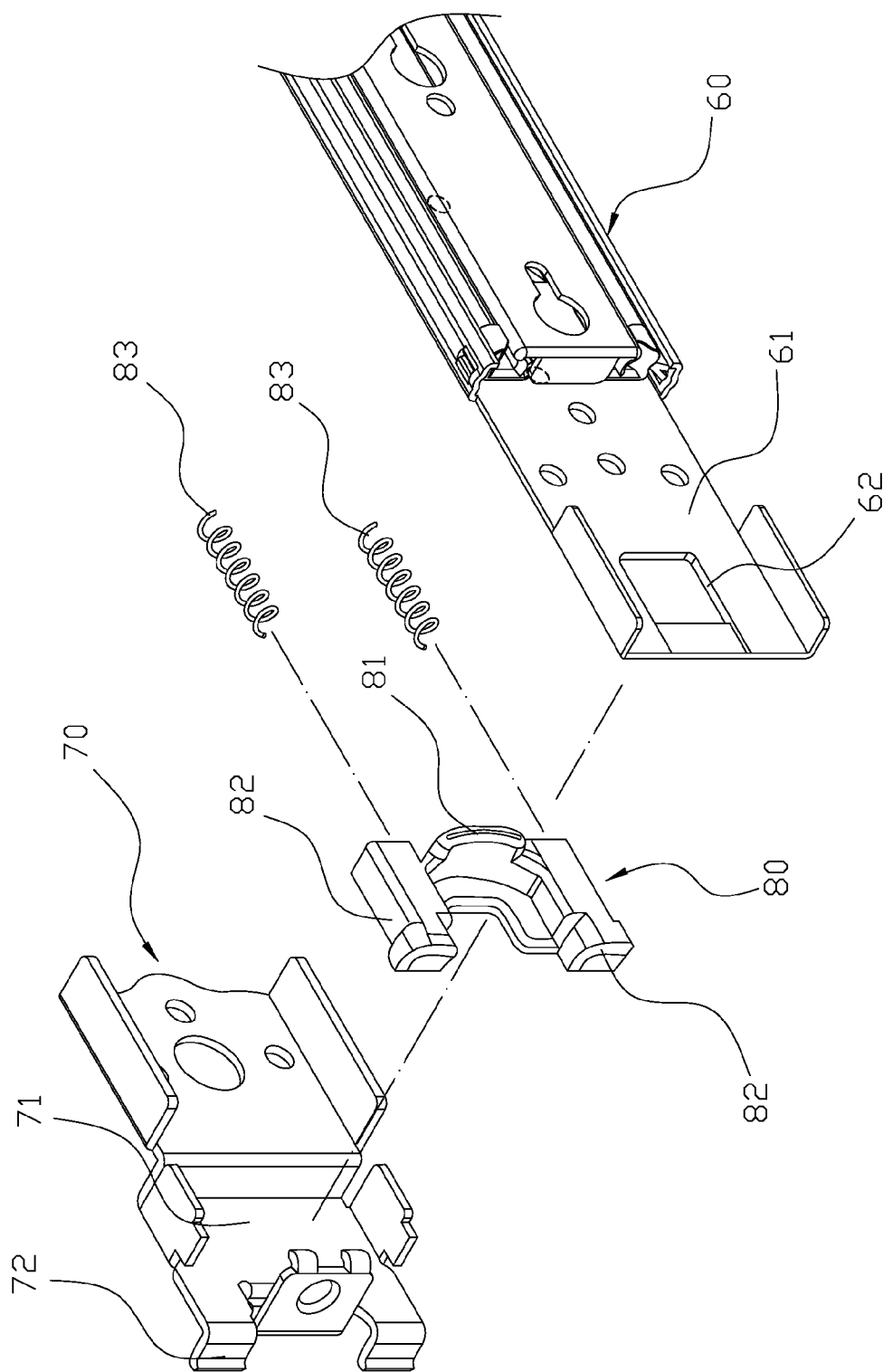
FIG. 9 shows a three-dimensional exploded view of the prior art.

In order to further understand the goal, characteristics and effect of the present invention, a number of embodiments along with the drawings are illustrated as following:

Referring to FIGS. 1, 2 and 3, a fast rail bracket securing structure for server may include a locking base 10, a sliding block 20 and a locking rack 30. One end of the locking base 10 has a hook portion 11 bended perpendicularly to the locking base 10, and a receiving space 12 is formed at the other end of the locking base 10, and the receiving space 12 has two stopping pieces 13 inside. The locking base 10 has a positioning board 14 reversibly perpendicular and located between two hook portions, and the positioning board 14 has a screw hole 141 with a corresponding bolt 15 (see FIG. 7) to increase the locking strength of the locking base 10. An outer restricting piece 16 is formed at both sides outside the hook portion 11 and a plurality of through holes 17 are formed at the locking base 10. The sliding block 20 is U-shaped with two parallel pins 21 and a driving portion 22. The sliding block 20 is disposed at the receiving space 12 of the locking base 10 and the pins 21 are protruding at the hook portion 11. Furthermore, a guiding angle 211 is formed at rear end of the pins 21 so the sliding block 20 can be more easily moved. A long slot 23 is formed at each pin 21 so the stopping piece 13 can be inserted therein, and a spring 24 is disposed between the long slot 23 and the stopping piece 13. Also, the long slot 23 has a stopping edge 231 near the rear end of the pin 21, which is used to prevent the spring 24 from popping out from the long slot 23. A guiding piece 25 is formed at outer portion of the rear end of each pin 21, and the guiding piece 25 is disposed at inner portion of the restricting piece 16. Also, the sliding block 20 has a plurality of oval holes 26 at the driving portion 22 corresponding to the through holes 17. One end of the locking rack 30 has a fixed portion 31 that is used to conjugate with a rail 40 at its outer portion, and the other end of the locking rack 30 has a covering board 32 to cover the receiving space 12 of the locking base 10, so that the sliding block 20 is restricted between the locking base 10 and the locking rack 30. The locking rack 30 has a curved portion 33 between the fixed potion 31 and the covering board 32 to increase the distance between the rail 40 and the sliding block 20. The locking rack 30 also has a controlling opening 34 at the covering board 32, so that the driving portion 22 of the sliding block 20 can partially expose outside the controlling opening 34 to further enhance the operation of the sliding block 20. The covering board 32 has notch 35 recessedly corresponding to the positioning board 14 of the locking base 10, and the notch 35 conjugates with the positioning board 14 to secure the locking base 10 and the lock rack 30. The covering board 32 has a plurality of through openings 321, and a rod 36 is corresponding to the through openings 321 and through holes 17 to restrict the movement of the sliding block 20 when the rod 36 passes through the oval hole 26. Both sides of the covering board 32 has a protruding inner restricting piece 37 facing the locking base 10, so that the inner restricting piece 37 can be disposed against inner portion of the guiding piece 25, and the sliding block 20 can slidingly move more smoothly between the inner restricting piece 37 and the restricting piece 16 through the guiding piece 25.

Figure 4:
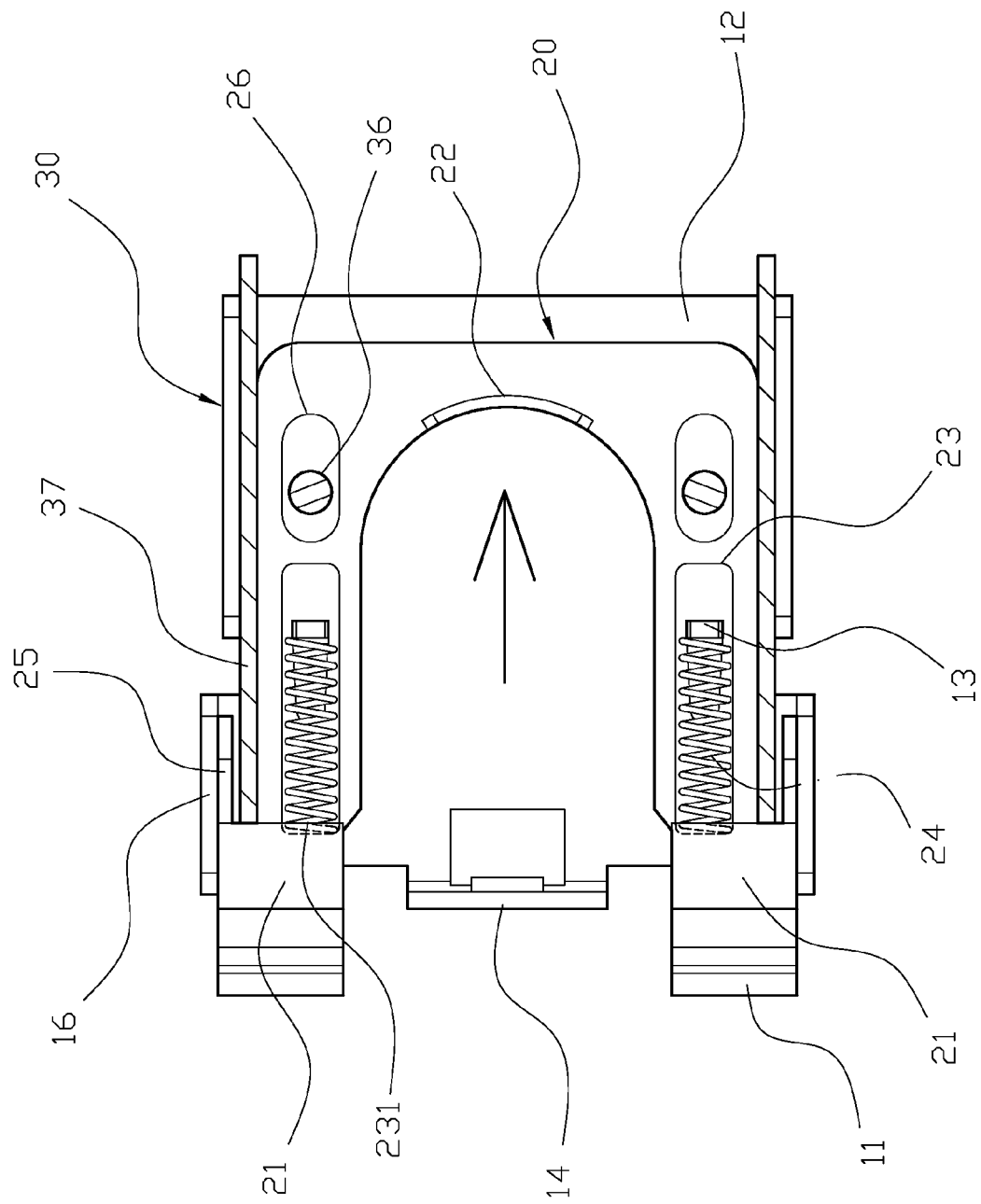
FIG. 4 illustrates a schematic view of the sliding block in the present invention.
Figure 5:
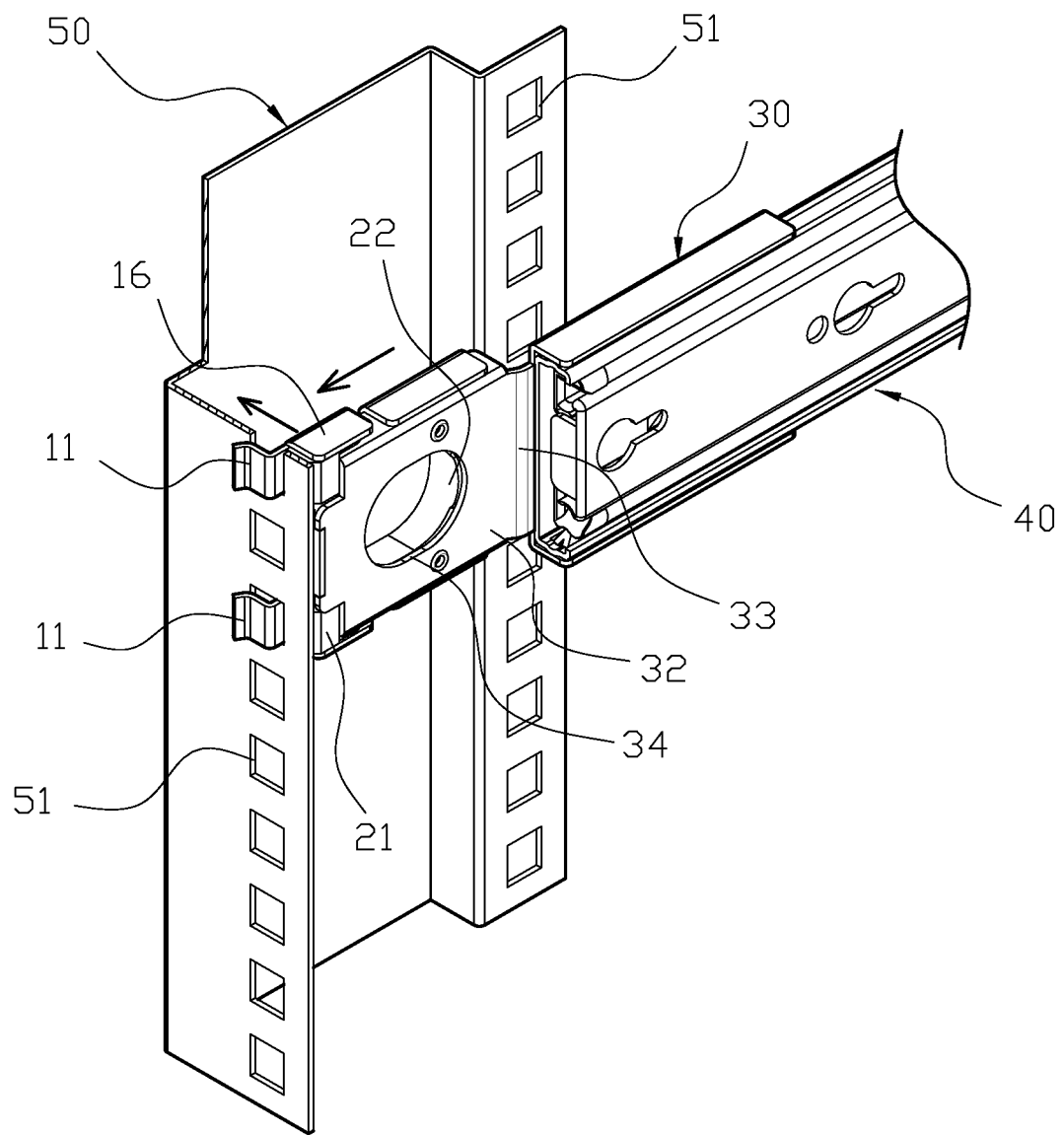
FIG. 5 illustrates a first schematic view of the fast rail bracket securing structure in the present invention when in use.
Figure 6:
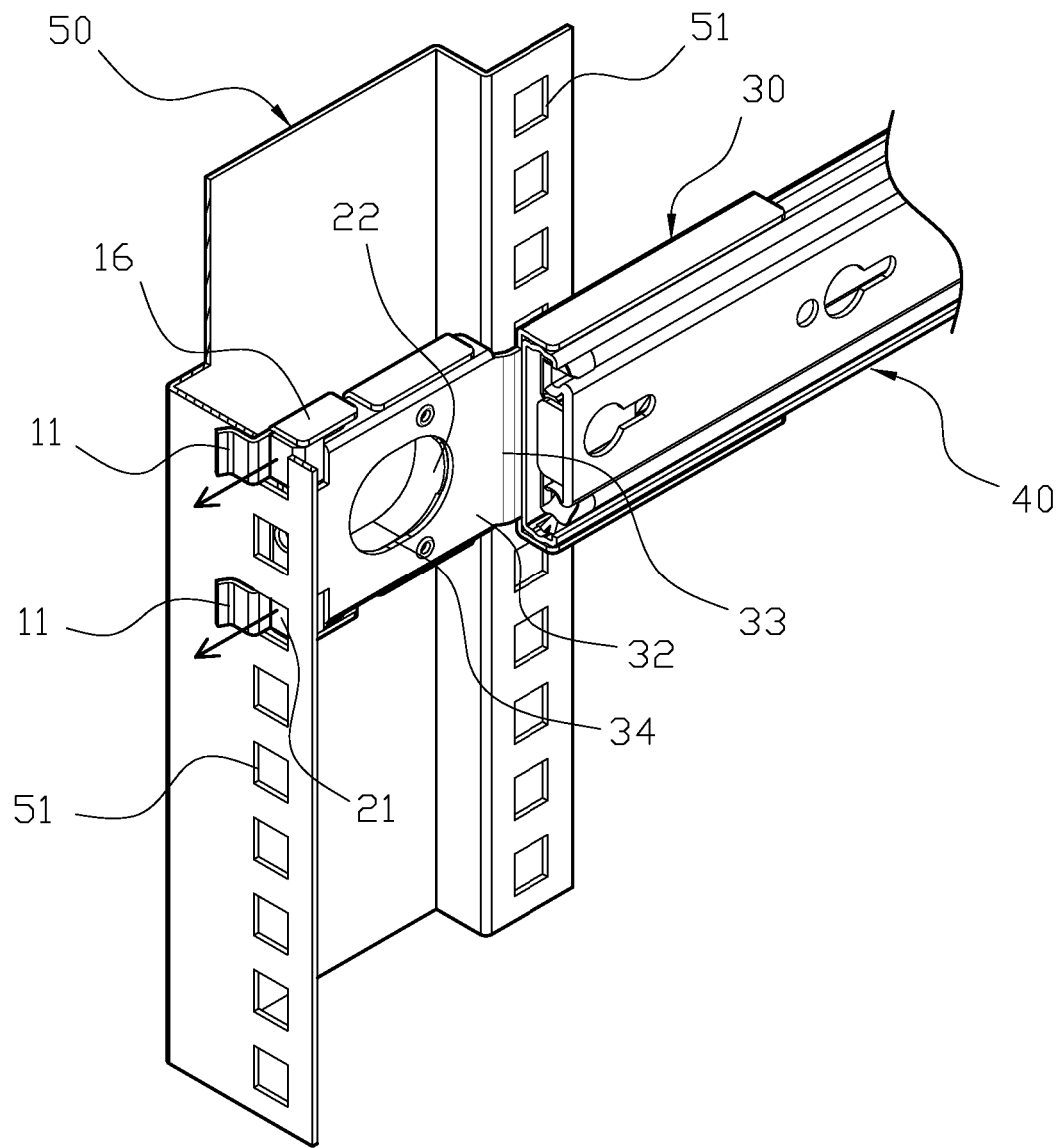
FIG. 6 illustrates a second schematic view of the fast rail bracket securing structure in the present invention when in use.

Referring to FIGS. 2 to 4 for the structure, the sliding block 20 is disposed in the receiving space 12 of the locking base 10 through the driving portion 22, and the pins 21 of the sliding block 20 are protruding from the hook portion 11. Meanwhile, the stopping piece 13 of the locking base 10 is located in the long slot 23 of the sliding block 20 and the spring 24 is disposed in the long slot 23, so that one end of the spring 24 is against the long slot near the pins 21, and the other end thereof is disposed against the stopping piece 13, and the sliding block 20 can be pushed to the hook portion 11 of the locking base 10 through the spring 24. Moreover, the covering board 32 of the locking rack 30 covers the receiving space 12 of the locking base 10, and the covering board 32 is used to restrict the sliding block 20 and spring 24. The controlling opening 34 of the covering board 32 enables the driving portion 22 of the sliding block 20 to expose, and the notch 35 conjugates with the positioning board 14 of the locking base 10 to secure the locking rack 30 and the locking base 10.

Furthermore, the through opening 321 is aligned with the through hole 17 of the locking base 10, and the rod 36 passes through the through opening 321, through hole 17 and oval hole 26 of the sliding block 20 to restrict the sliding block 20's sliding distance. It is noted that the outer portion of the guiding piece 25 of the sliding block 20 is disposed against the outer restricting piece 16 of the locking base 10, while the inner portion of the guiding piece 25 of the sliding block 20 is disposed against the inner restricting piece 37 of the locking base 10, so the sliding block 20, locking base 10 and locking rack 30 can be more precisely positioned and the smoothness of the movement of the sliding block is enhanced through the configuration of the guiding piece 25 with the inner restricting piece 37 and outer restricting piece 16. More importantly, the guiding piece 25 can increase pin 21's capability to sustain heavy objects, so the pins 21 will not be easily deformed to increase the life of the sliding block 20. The final step to assemble the structure in the present invention is to secure the locking rack 30 at one end of the rail 40 through the fixed portion 31.

Referring to FIGS. 2 to 8, the locking base 10, sliding block 20 and locking rack 30 are secured at one end of the rail 40, so that the rail 40 can be installed in a server cabinet and the server or other electronic devices can be disposed therein. Each of the four corners of the server cabinet has a supporting column 50 with a plurality of conjugating openings 51 thereon. The hook portion 11 of the locking base 10 is inserted into the conjugating opening 51 of the supporting column 50 and the edge of the conjugating opening 51 pushes the pins 21 of the sliding block 20, so the sliding block 20 pushes the spring 24 to move toward the receiving space 12 of the locking base 10, and the hook portion 11 can pass through the conjugating opening 51. When the hook portion 11 passes through, the pins 21 of the sliding block 20 can subsequently conjugate with the conjugating opening 51 of the supporting column 50. Along with the hook portion 11, it is difficult for the rail 40 to detach from the supporting column 50.

Moreover, the curved portion 33 is formed between the fixed portion 31 and covering board 32 to provide a predetermined distance between the sliding block 20 and rail 40, so the rail 40 will not hit the supporting column 50 during its movement. When the user wants to uninstall the rail 40, the driving portion 22 of the sliding block 20 can be pushed at the controlling opening 34 of the locking rack 30, and the pins 21 of the sliding block 20 detach from the conjugating opening 51 of the supporting column 50, so the hook portion 11 of the locking base 10 can separate from the conjugating opening 51.

According to the embodiments described above, the present invention is advantageous because (i) the outer portion of the guiding piece 25 of the sliding block 20 is disposed against the outer restricting piece 16 of the locking base 10, while the inner portion of the guiding piece 25 of the sliding block 20 is disposed against the inner restricting piece 37 of the locking base 10, so the sliding block 20, locking base 10 and locking rack 30 can be more precisely positioned and the smoothness of the movement of the sliding block is enhanced through the configuration of the guiding piece 25 with the inner restricting piece 37 and outer restricting piece 16. More importantly, the guiding piece 25 can increase pin 21's capability to sustain heavy objects, so the pins 21 will not be easily deformed to increase the life of the sliding block 20; (ii) the spring 24 is disposed between the long slot 23 and the stopping piece 13. Also, the long slot 23 has a stopping edge 231 near the rear end of the pin 21, which is used to prevent the spring 24 from popping out from the long slot 23; and the rod 36 is corresponding to the through openings 321 and through holes 17 to restrict the movement of the sliding block 20 when the rod 36 passes through the oval hole 26 and to further prevent the spring 24 from being overly pressed which may cause fatigue of the spring 24; and (iii) the curved portion 33 is formed between the fixed portion 31 and covering board 32 to provide a predetermined distance between the sliding block 20 and rail 40, so the rail 40 will not hit the supporting column 50 during its movement to increase the conjugating strength.

Having described the invention by the description and illustrations above, it should be understood that these are exemplary of the invention and are not to be considered as limiting. Accordingly, the invention is not to be considered as limited by the foregoing description, but includes any equivalents.

What is claimed is:

1. A fast rail bracket securing structure for a server comprising:
    a locking base, one end of which having two hook portions bended perpendicularly to the locking base, and a receiving space formed at the other end of the locking base, and the receiving space has two stopping pieces inside, wherein the locking base has a positioning board reversibly perpendicular with respect to the hook portions and located between the two hook portions, and an outer restricting piece is formed outside of each hook portions and a plurality of through holes are formed at the locking base;
    a sliding block that is U-shaped with two parallel pins and a driving portion, wherein the sliding block is disposed at the receiving space of the locking base and the parallel pins are protruding at the hook portions, wherein a long slot is formed at each pin so one of the stopping pieces is inserted therein, and a spring is disposed between the long slot and the stopping piece, wherein a guiding piece is formed at outer portion of a rear end of each pin, and the guiding piece is disposed at inner portion of the outer restricting piece, and the sliding block has a plurality of oval holes at the driving portion corresponding to the through holes; and
    a locking rack, one end of which having a fixed portion that is used to conjugate with a rail at its outer portion, and the other end of which having a covering board to cover the receiving space of the locking base, so that the sliding block being restricted between the locking base and the locking rack, wherein the covering board has a plurality of through openings, and a rod is formed corresponding to the through openings and through holes to restrict the movement of the sliding block when the rod passes through the oval hole, wherein both sides of the covering board has a protruding inner restricting piece facing the locking base, so that the inner restricting piece is disposed against an inner portion of the guiding piece, and the sliding block is able to slidingly move more smoothly between the inner restricting piece and the outer restricting piece through the guiding piece.

2. The fast rail bracket securing structure for a server of claim 1, wherein the positioning board has a screw hole with a corresponding bolt to increase the locking strength of the locking base.

3. The fast rail bracket securing structure for a server of claim 1, wherein a guiding angle is formed at the rear end of the pins.

4. The fast rail bracket securing structure for a server of claim 1, wherein the long slot has a stopping edge near the rear end of the pin, which is used to prevent the spring from popping out from the long slot.

5. The fast rail bracket securing structure for a server of claim 1, wherein the locking rack has a controlling opening at the covering board, so that the driving portion of the sliding block is able to partially expose outside the controlling opening to further enhance the operation of the sliding block.

6. The fast rail bracket securing structure for a server of claim 1, wherein the covering board has a notch recessedly corresponding to the positioning board of the locking base, and the notch conjugates with the positioning board to secure the locking base and the locking rack.

7. The fast rail bracket securing structure for a server of claim 1, wherein the locking rack has a curved portion between the fixed potion and the covering board to increase the distance between the rail and the sliding block.

* * * * *